United States Patent
Wu et al.

(10) Patent No.: US 12,169,345 B2
(45) Date of Patent: Dec. 17, 2024

(54) ELECTROCHROMIC POLYMERS WITH POLAR SIDE CHAINS

(71) Applicant: AMBILIGHT INC., Milpitas, CA (US)

(72) Inventors: Wenting Wu, Lafayette, IN (US); Liyan You, West Lafayette, IN (US); Jianguo Mei, West Lafayette, IN (US)

(73) Assignee: AMBILIGHT INC., Milpitas, CA (US)

( * ) Notice: Subject to any disclaimer, the term of this patent is extended or adjusted under 35 U.S.C. 154(b) by 792 days.

(21) Appl. No.: 17/360,354

(22) Filed: Jun. 28, 2021

(65) Prior Publication Data

US 2022/0019118 A1     Jan. 20, 2022

Related U.S. Application Data

(60) Provisional application No. 63/052,498, filed on Jul. 16, 2020.

(51) Int. Cl.
| | |
|---|---|
| *G02F 1/155* | (2006.01) |
| *C08G 61/12* | (2006.01) |
| *C09D 165/00* | (2006.01) |
| *G02F 1/1516* | (2019.01) |

(52) U.S. Cl.
CPC ....... *G02F 1/15165* (2019.01); *C08G 61/126* (2013.01); *C09D 165/00* (2013.01); *G02F 1/155* (2013.01); *C08G 2261/1424* (2013.01); *C08G 2261/3223* (2013.01); *C08G 2261/54* (2013.01); *C08G 2261/63* (2013.01); *G02F 2001/1555* (2013.01); *G02F 2202/022* (2013.01)

(58) Field of Classification Search
CPC .............. G02F 1/155; G02F 1/15165; G02F 2001/1555; G02F 2202/022; C08G 61/126
See application file for complete search history.

(56) References Cited

U.S. PATENT DOCUMENTS

| | | |
|---|---|---|
| 2004/0220346 A1 | 11/2004 | Kaneko et al. |
| 2006/0110427 A1 | 5/2006 | Molock et al. |
| 2017/0240476 A1 | 8/2017 | Baumann et al. |

FOREIGN PATENT DOCUMENTS

| | | |
|---|---|---|
| CN | 1537876 A | 10/2004 |
| CN | 101102749 A | 1/2008 |
| CN | 107848901 A | 3/2018 |

OTHER PUBLICATIONS

Lisa R. Savagian, Anna M. Österholm, James F. Ponder Jr., K. Barth and John R. Reynolds, Balancing Charge Storage and Mobility in an Oligo(Ether) Functionalized Dioxythiophene Copolymer for Organic- and Aqueous-Based Electrochemical Devices and Transistors, Adv. Mater. 2018, 30, 1804647 (1of 6) (Year: 2018).*

Ali Cirpan, Avni A. Argun, Christophe R. G. Grenier, Benjamin D. Reeves and John R. Reynolds, Electrochromic devices based on soluble and processable dioxythiophene polymers, J. Mater. Chem., 2003, 13, 2422-2428 (Year: 2003).*

(Continued)

*Primary Examiner* — Bijan Ahvazi

(57) ABSTRACT

An electrochromic polymer with polar side chains is disclosed. The viscosity of the electrochromic polymer is controllable by adjusting a ratio between polar side chains and alkyl side chains for forming the electrochromic polymer. The disclosed electrochromic polymer with polar side chains can be also made into a film with a controllable thickness by coating.

7 Claims, 18 Drawing Sheets

(56) References Cited

OTHER PUBLICATIONS

Jiazhi He, Liyan You, and Jianguo Mei, Self-Bleaching Behaviors in Black-to-Transmissive Electrochromic Polymer Thin Films, ACS Appl. Mater. Interfaces 2017, 9, 34122-34130 (Year: 2017).*
Savagian et al., "Balancing Charge Storage and Mobility in an Oligo(Ether) Functionalized Dioxythiophene Copolymer for Organic- and Aqueous-Based Electrochemical Devices and Transistors", Advanced Materials, vol. 30, No. 50, Dec. 2018, 1804647, 6 pages.

* cited by examiner

ELECTROCHROMIC POLYMERS WITH POLAR SIDE CHAINS

CROSS REFERENCE TO RELATED APPLICATIONS

This application claims priority to and benefits of Provisional Application No. 63/052,498, filed on Jul. 16, 2020, the content of which is incorporated herein by reference in its entirety.

TECHNICAL FIELD

The present disclosure is generally related to electrochromic polymers, and more particularly, directed to electrochromic polymers with polar side chains.

BACKGROUND

Electrochromic polymers have found their great applications in various devices, such as electrochromic devices, organic solar cells, organic field-effect transistors, Organic Light-Emitting Diode (OLED). To be integrated into these devices, electrochromic polymers need to be processed into a thin film from an electrochromic polymer solution. The viscosity of the electrochromic polymer solution plays a crucial role in film processing and film characteristics. For example, high viscosity provides the film with good tensile strength, but also leads to lateral shrinkage of film and eventually leads to unavoidable cracks. Low viscosity can increase coating speed and efficiency but produce a film with lower tensile strength and unstable morphology. Thus, it is highly desired to have a simple way to control the viscosity of the electrochromic polymer in regular film processing solutions to accommodate the needs of both film processing and film characteristics. In addition, to establish a capability to prepare the thin film with a controllable thickness is also critical to advance the device applications.

SUMMARY

The present invention is related to an electrochromic polymer with polar side chains.

The disclosed electrochromic polymer comprises a formula of

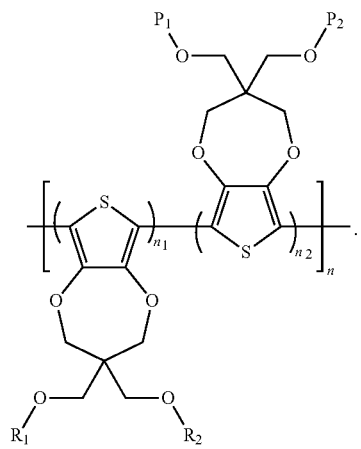

In this formula, $n$, $n_1$, and $n_2$ are integers greater than 0;

$R_1$ and $R_2$ are independently selected from a group including, but not limited to, $C_1$-$C_{30}$ alkyl, $C_2$-$C_{30}$ alkenyl, $C_2$-$C_{30}$ alkynyl, $C_3$-$C_{15}$ cycloalkyl, $C_5$-$C_{30}$ cycloalkylalkyl, $C_3$-$C_{30}$ heterocyclylalkyl, or $C_3$-$C_{30}$ heteroarylalkyl;

$P_1$ and $P_2$ are polar side chains;

the disclosed electrochromic polymer has an intrinsic viscosity.

In some embodiments, the polar side chains for the disclosed electrochromic polymer include a group of oligoethers with a formulas of

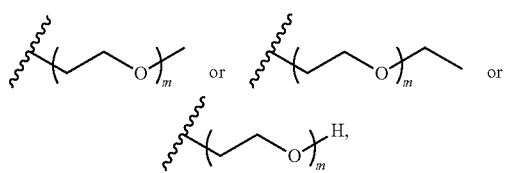

where m is an integer greater than 0.

The viscosity of the disclosed electrochromic polymer is controlled by adjusting a ratio between $n_1$ and $n_2$.

In some embodiments, the electrochromic polymer comprises a formula of

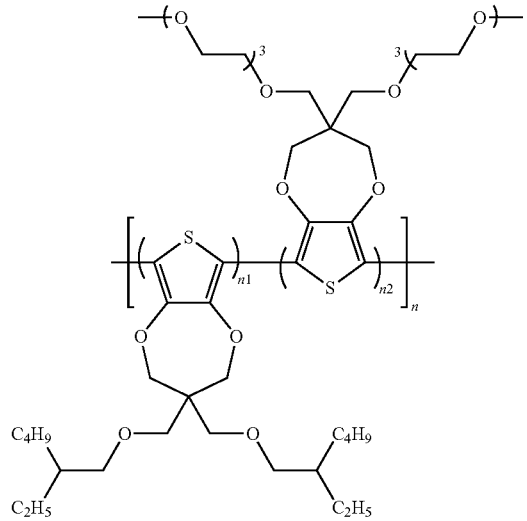

In some embodiments, the disclosed electrochromic polymer has triethylene glycol (TEG) side chains. A concentration of the TEG side chains of the electrochromic polymer can be calculated as $100\% \times n_2/(n_1+n_2)$, and the TEG concentration is higher than 0 molar % and lower than 50 molar %.

This invention also discloses a thin film that is made of an electrochromic polymer disclosed herein by coating techniques. The thickness of the thin film made of an electrochromic polymer disclosed herein can be controlled by adjusting a ratio between $n_1$ and $n_2$.

In another aspect, a method for adjusting an intrinsic viscosity of an electrochromic polymer is provided. The method comprises adjusting a concentration of polar side chains of the electrochromic polymer to adjust the intrinsic viscosity of the electrochromic polymer.

In another aspect, a method is provided for adjusting a film thickness of a thin film made of an electrochromic polymer by coating. The method comprises adjusting a concentration of polar side chains of the electrochromic polymer.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the invention are utilized, and the accompanying drawings below. For the purpose of illustrating the invention, the drawings show aspects of one or more embodiments of the invention. However, it should be understood that the present invention is not limited to the precise arrangements and instrumentalities shown in the drawings.

DETAILED DESCRIPTION OF EMBODIMENTS

Figure 1:
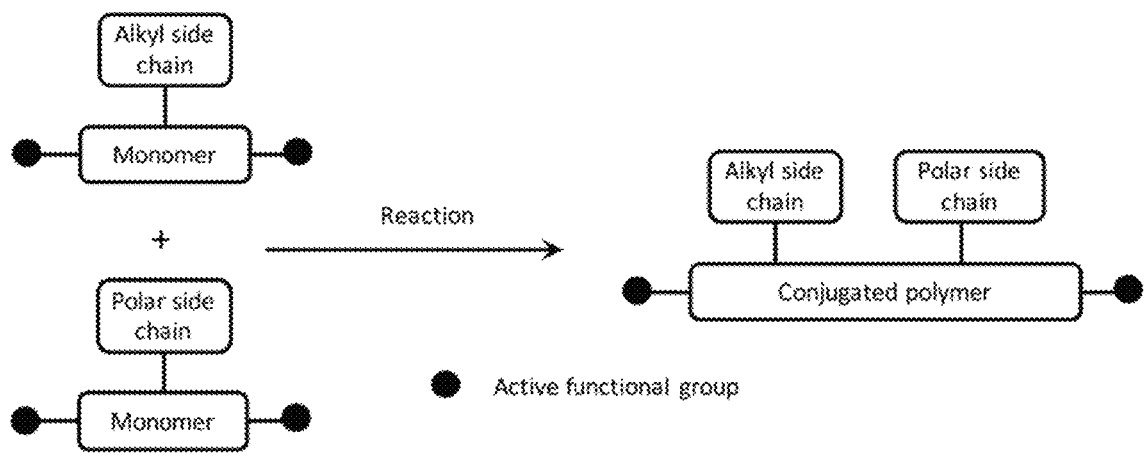
FIG. 1 shows a simplified scheme for synthesizing electrochromic polymers disclosed herein with an adjustable ratio between polar and alkyl side chains with a controlled viscosity, according to one example embodiment.

In the following description, certain specific details are set forth in order to provide a thorough understanding of various embodiments of the invention. However, one skilled in the art will understand that the invention may be practiced without these details. Moreover, while various embodiments of the invention are disclosed herein, many adaptations and modifications may be made within the scope of the invention in accordance with the common general knowledge of those skilled in this art. Such modifications include the substitution of known equivalents for any aspect of the invention in order to achieve the same result in substantially the same way.

Unless the context requires otherwise, throughout the present specification and claims, the word "comprise" and variations thereof, such as "comprises" and "comprising" are to be construed in an open, inclusive sense, that is as "including, but not limited to." Recitation of numeric ranges of values throughout the specification is intended to serve as a shorthand notation of referring individually to each separate value falling within the range inclusive of the values defining the range, and each separate value is incorporated in the specification as it was individually recited herein. Additionally, the singular forms "a" "an", and "the" include plural referents unless the context clearly dictates otherwise.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment, but may be in some instances. Furthermore, the particular features, structures, or characteristics may be combined in any suitable manner in one or more embodiments.

This invention is related to an electrochromic polymer with polar side chains.

The present invention relates to an electrochromic polymer comprising the formula 1 of:

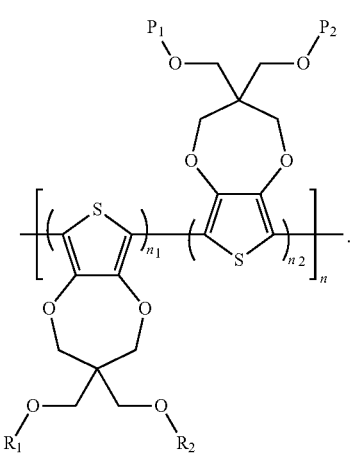

In this formula, $R_1$ and $R_2$ are independently selected from a group including, but not limited to, $C_1$-$C_{30}$ alkyl, $C_2$-$C_{30}$ alkenyl, $C_2$-$C_{30}$ alkynyl, $C_3$-$C_{15}$ cycloalkyl, $C_5$-$C_{30}$ cycloalkylalkyl, $C_3$-$C_{30}$ heterocyclylalkyl, or $C_3$-$C_{30}$ heteroarylalkyl;

$P_1$ and $P_2$ are polar side chains. Such polar side chains include, but is not limited to, one or more of carboxylic acids, oligoether, and sulfonates. Example polar side chains include a group of oligoether, such as

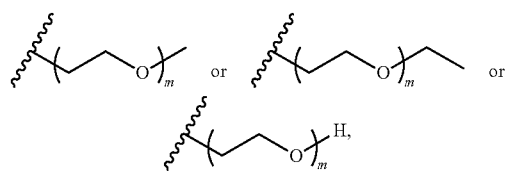

where m is an integer greater than 0.

n, $n_1$, $n_2$ are integers greater than 0. The values of $n_1$, $n_2$ may indicate ratios of two monomer units, but not necessarily the actual monomer sequence in the polymer. The method to make this disclosed polymer might include regular polymerization or random polymerization.

The viscosity of the electrochromic polymer can be controlled by introducing a different amount of polar side chains to the electrochromic polymer. A polar side chain includes, but is not limited to, one or more of carboxylic acids, oligoether, sulfonates, etc. A concentration of polar side chains in the disclosed electrochromic polymer is controlled by adjusting a ratio between alkyl side chains and polar side chains ($n_1$:$n_2$) and calculated according to 100%× $n_2$/($n_1$+$n_2$). More polar side chains are achieved by a lower ratio of $n_1$ to $n_2$. The strong affinity of polar side chains from different polymer backbones eventually leads to the higher viscosity of the disclosed electrochromic polymer, especially in a non-polar solvent. Polar solvents, such as chloroform, may affect the affinity force of polar side chains from different polymer backbones, so the effects on viscosity may be hard to predict.

The disclosed electrochromic polymer can be made into a thin film with a thickness by coating, and the thickness of the electrochromic thin film is also controlled by adjusting the ratio between $n_1$ to $n_2$. In some embodiments, ITO/glass (a piece of glass coated with ITO) is used as the substrate for thin film deposition, and non-polar solvent, p-xylene, is used as the solvent. When more polar side chains are introduced with a lower $n_1$ to $n_2$ ratio, the higher affinity is obtained between the hydrophilic polar side chain and ITO substrate, and the higher viscosity leads to an increased thin film thickness of the disclosed electrochromic polymer.

The disclosed electrochromic polymer can be prepared by reacting monomers having alkyl side chains with monomers having polar side chains. FIG. 1 shows a simplified preparation scheme to make the disclosed electrochromic polymer. Monomers having alkyl side chains react with monomers having polar side chains, resulting in the electrochromic polymer with both polar and alkyl side chains. The reactive functional groups on monomers having polar side chains and monomers having alkyl side chains can be any functional groups that can form chemical bonds, such as, Cl, Br, I, H, OTf, B(OH)$_2$, Sn(Me)$_3$, Sn(Bu)$_3$, Sn($^t$Bu)$_3$, Bpin, MgBr, MgCl. The reactions to form the disclosed electrochromic polymer with polar side chains can be any polymerization.

In some embodiments, TEG is used as the polar side chains for $P_1$ and $P_2$, and 2-ethylhexyloxy is used as $R_1$ and $R_2$. An example electrochromic polymer may comprise a formula of

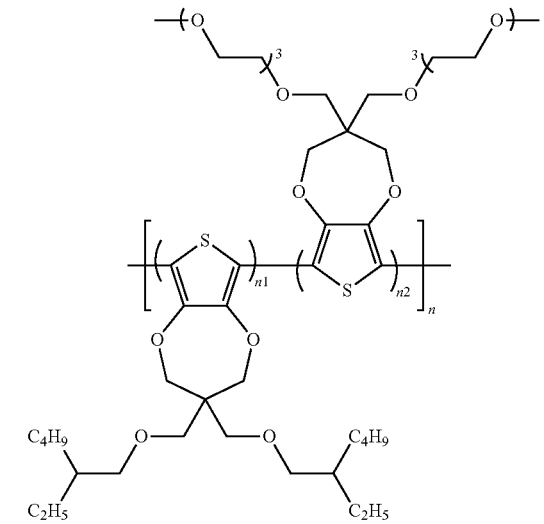

where n, $n_1$, $n_2$ are integers greater than 0.

The disclosed electrochromic polymer has a concentration of TEG side chains, which is calculated as 100%×$n_2$/($n_1$+$n_2$). Different theoretical $n_2$ to $n_1$ ratios are used to introduce different TEG concentration, as listed in Table 1.

TABLE 1

Example $n_2$ to $n_1$ ratios and TEG concentration amounts in exemplary embodiments.

| Electrochromic Polymer | Theoretical $n_2$:$n_1$ | TEG concentration (molar %) |
|---|---|---|
| $CP_1$ | 1:19 | 5% |
| $CP_2$ | 3:17 | 15% |
| $CP_3$ | 5:15 | 25% |
| $CP_4$ | 6:14 | 30% |
| $CP_5$ | 1:1 | 50% |
| $CP_6$ | 1:0 | 100% |

Figure 2:
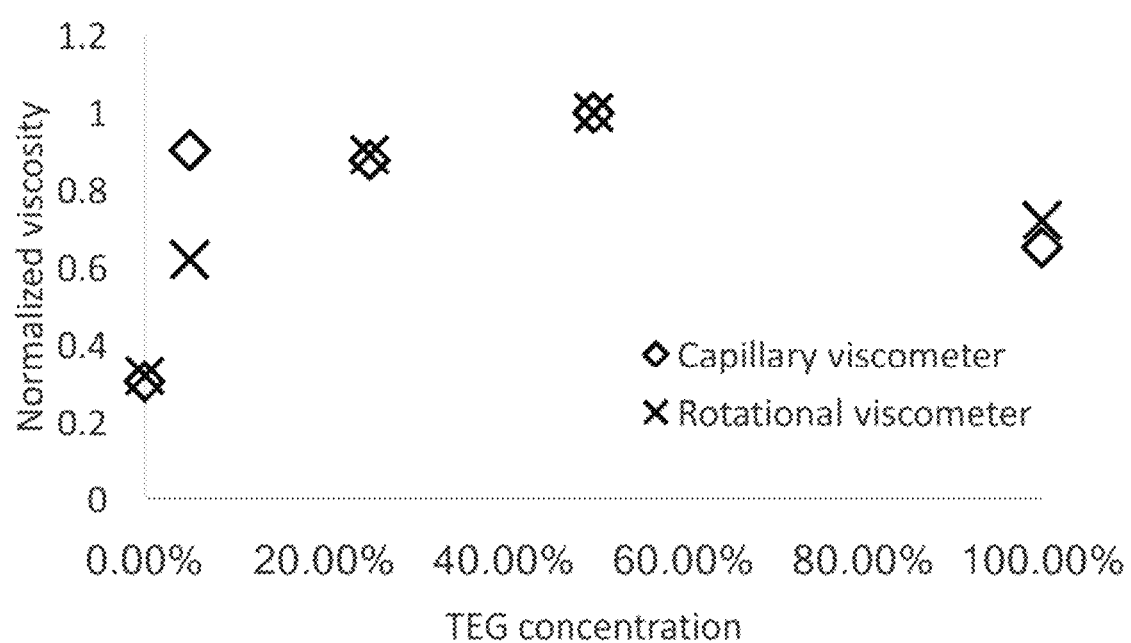
FIG. 2 shows normalized viscosities of electrochromic polymers disclosed here dissolved in p-xylene, according to some example embodiments.

For each example electrochromic polymer, p-xylene is used as the solvent. The viscosity of the electrochromic polymer in p-xylene is measured and confirmed by two methods. One is using a capillary viscometer which uses capillary tubes and measuring the time it took for a volume of liquid to pass through the length of the tube. The other one is using a rotational viscometer which measures the torque required to turn an object into a fluid as a function of that fluid's viscosity. For better comparison of the electrochromic polymers with various TEG concentrations, the measured viscosity is normalized and shown in FIG. 2. Viscosity data of the electrochromic polymer without TEG side chains and 100% TEG side chains in p-xylene ($CP_6$) are also included for comparison. Both measurements show that the viscosity increases with the increasing of TEG concentration when the TEG concentration (molar %) is between 0% and 50%. The electrochromic polymer with 100% TEG concentration shows lower viscosity when compared to that of the electrochromic polymers with 50% and 25% TEG concentration.

Figure 3:
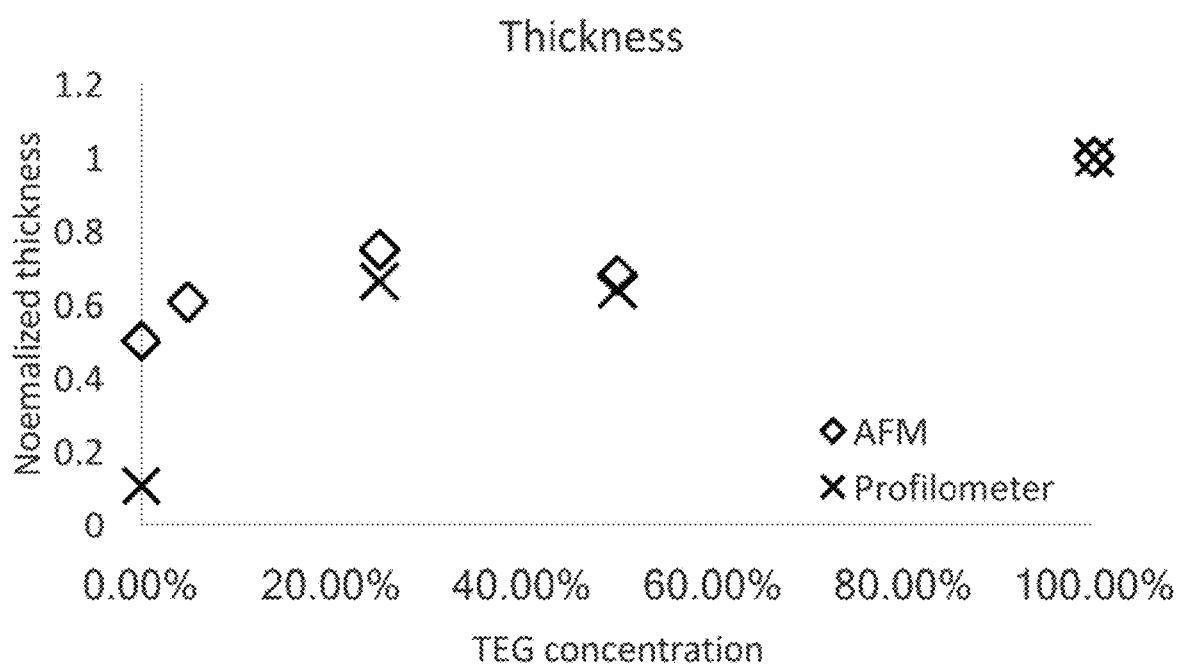
FIG. 3 shows normalized thicknesses of electrochromic thin films prepared with the disclosed electrochromic polymers, according to some example embodiments.

For applications in various devices, the disclosed electrochromic polymer is processed into a thin film after coating. The coating technique includes, but is not limited to, spin coating technique. The p-xylene solutions of the example electrochromic polymers with the concentration of 40 mg/ml are used for spin coating of thin films. For each example electrochromic polymer, 0.1 mL example electrochromic polymer solution is spin-coated onto a 20*30*0.7 mm ITO substrate at the speed of 1500 rpm for 120 seconds. Both contact profilometer and AFM measurement are used for thin film thickness determination. The measured thicknesses for electrochromic thin films with different TEG concentration are shown in FIG. 3 as normalized thickness. Thickness data of electrochromic thin film without TEG side chains and 100% TEG side chains are also included for comparison. Both measurements show that the thickness increases with increased TEG concentration when the TEG concentration (molar %) is between 0% and 100%. The greater thickness with 100% TEG concentration may be because of the strong affinity between TEG side chains and hydrophilic ITO substrates.

The polar side chain is soluble with polar electrolyte solvents, for example, propylene carbonate (PC). Thus, the thin film of the electrochromic polymer with 100% TEG concentration is dissolved in PC when working with LiTFSI/PC electrolyte. When working with PC-based electrolytes, appropriate concentration of the polar side chain need to be selected to avoid dissolution.

To study the electrochromic performance of the disclosed electrochromic polymer, the electrochromic thin film for each example electrochromic polymer is tested in a three-electrode configuration as the working electrode with Ag/AgCl as the reference electrode, and Pt wire as the counter electrode.

Figure 4:
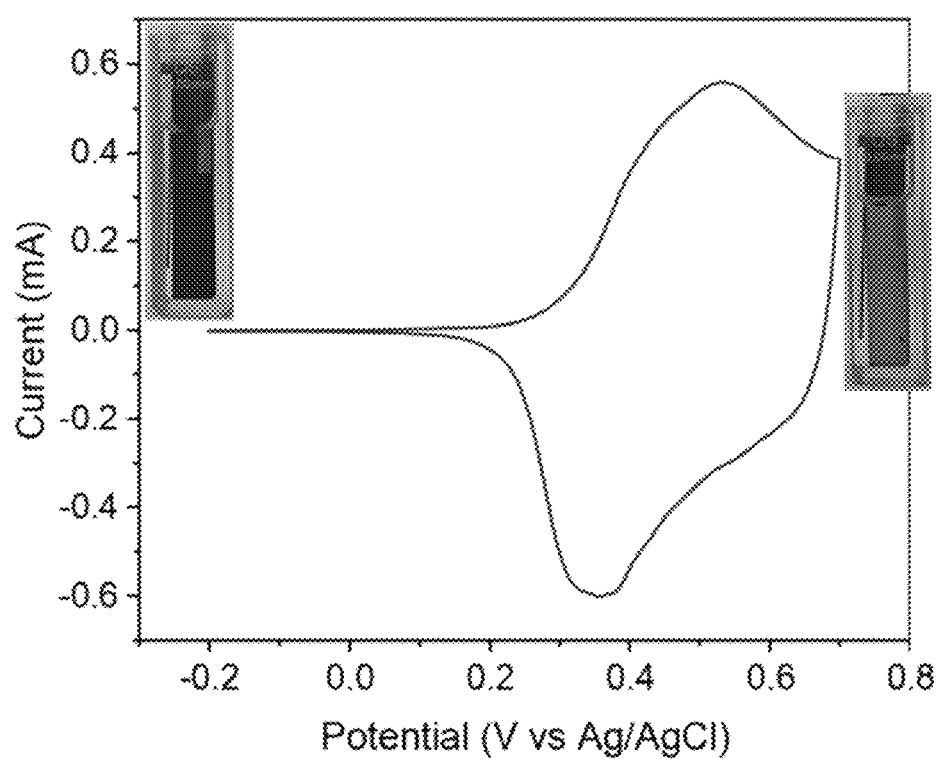
FIG. 4 shows the cyclic voltammogram of an example electrochromic thin film with the electrochromic polymer $CP_1$. The upper-right insertion is an image of the thin film at a bleached state, and the lower-left insertion is an image of the thin film at a colored state, according to one exemplary embodiment.
Figure 5:
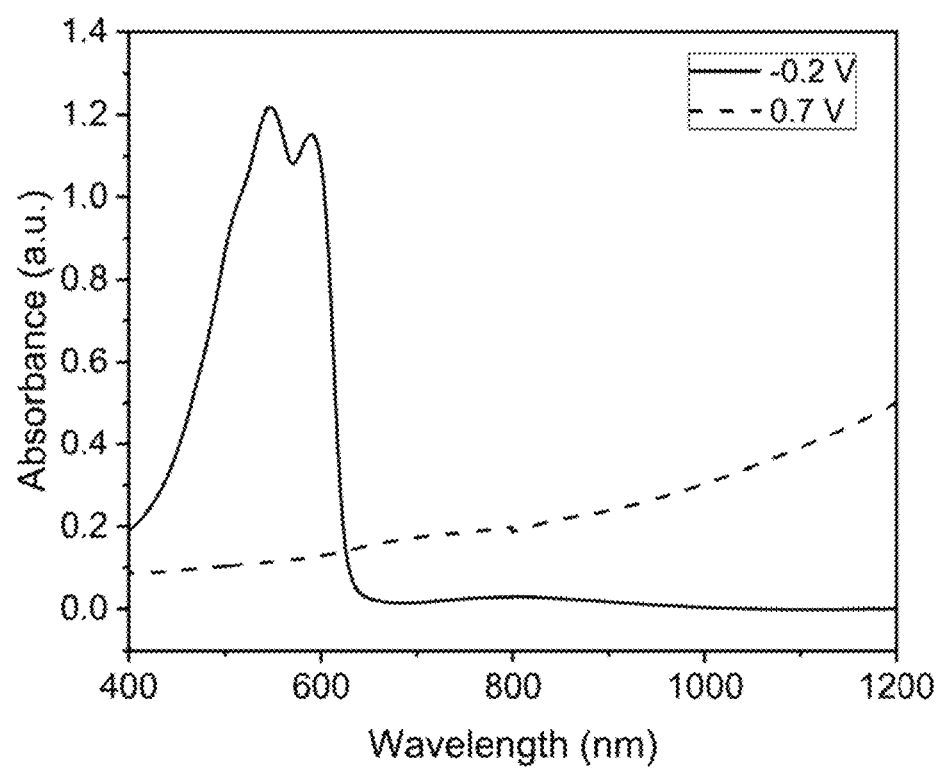
FIG. 5 is the UV-Vis absorption spectra at a colored state and a bleached state of an example electrochromic thin film of the electrochromic polymer $CP_1$, according to one exemplary embodiment.
Figure 6:
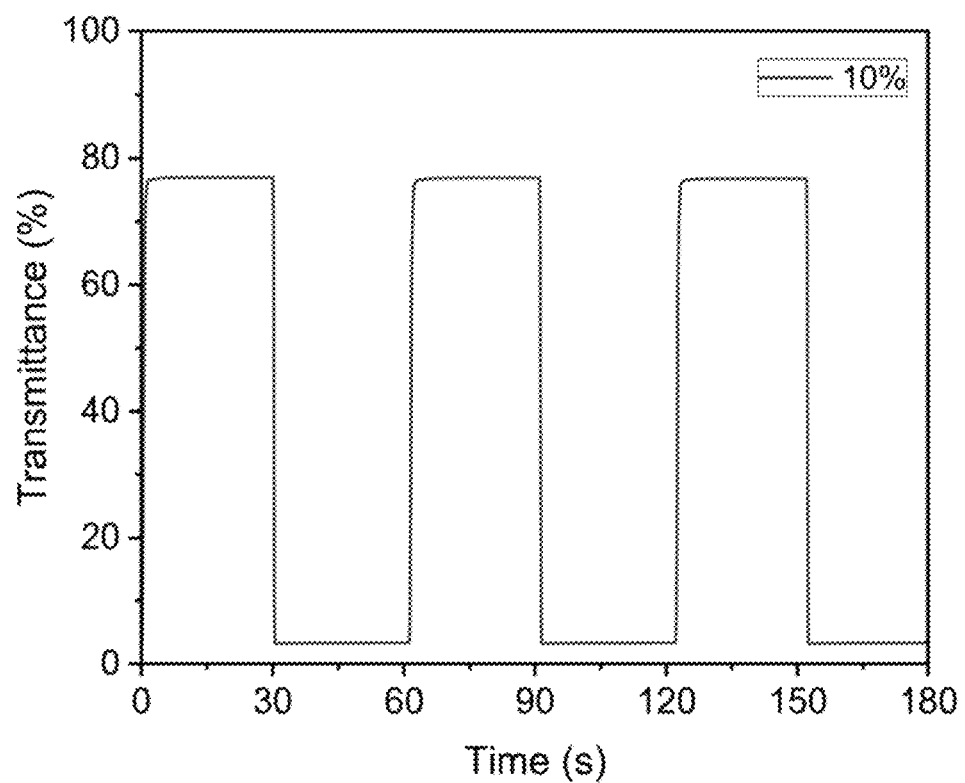
FIG. 6 is a diagram illustrating switching kinetics of an example electrochromic thin film of the electrochromic polymer $CP_1$, according to one exemplary embodiment.

For the example electrochromic polymer with 5% TEG concentration, the electrochromic thin film shows magenta color at the colored state and highly transparent when oxidized at 0.7 V, as shown by the cyclic voltammogram and insertions of the thin film images in FIG. 4. As shown in FIG. 5, the example electrochromic polymer thin film has high absorption at the wavelength around 550 nm when reduced (solid line), while very low absorbance in the visible light wavelength when oxidized (dashed line). The example electrochromic polymer thin film maintains a stable switching kinetic with ~80% optical contrast at 550 nm when switching between −0.2 V to 0.7 V, as shown in FIG. 6.

Figure 7:
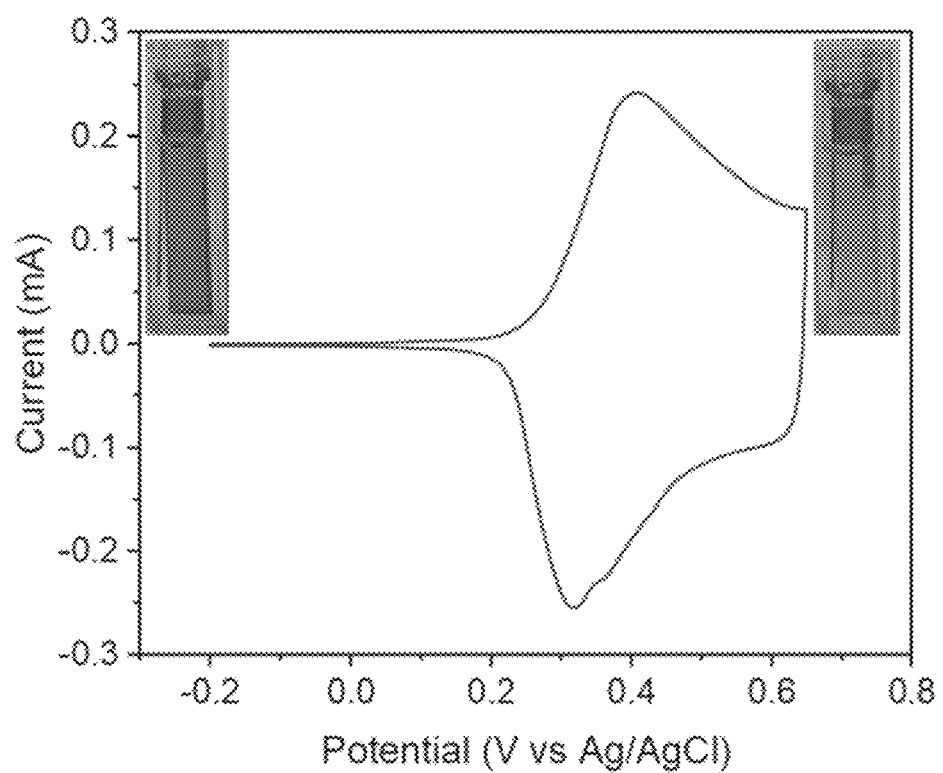
FIG. 7 shows the cyclic voltammogram of an example electrochromic thin film of the electrochromic polymer $CP_3$. The upper-right insertion is an image of the thin film at a bleached state, while the lower-left insertion is an image of the thin film at a colored state, according to one exemplary embodiment.
Figure 8:
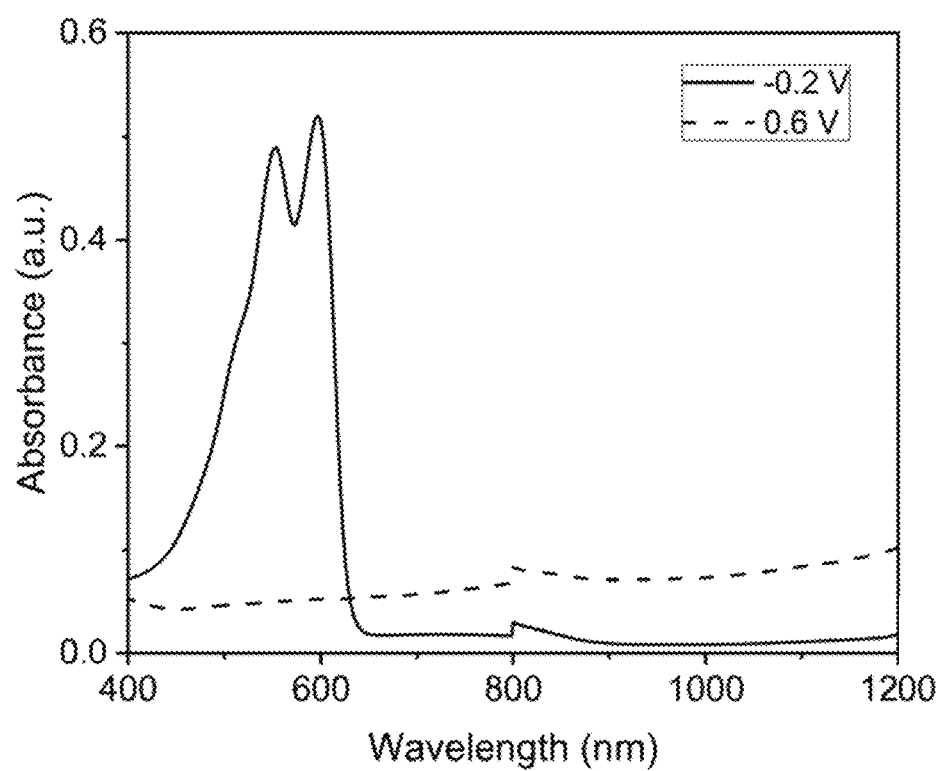
FIG. 8 is the UV-Vis absorption spectra at a colored state and a bleached state of an example electrochromic thin film of the electrochromic polymer $CP_3$, according to one exemplary embodiment.
Figure 9:
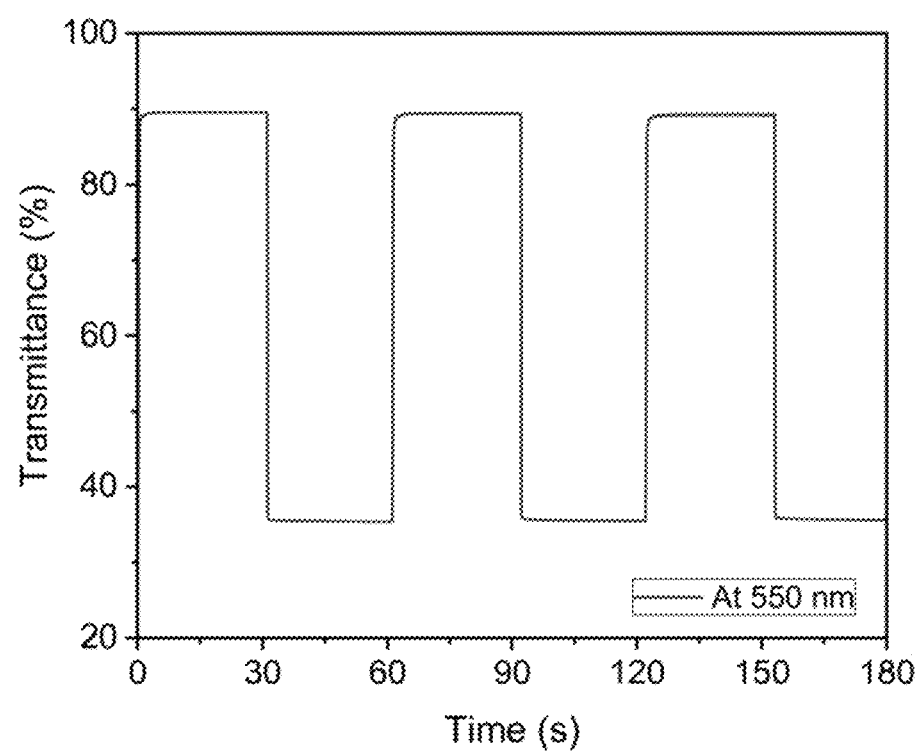
FIG. 9 is a diagram illustrating switching kinetics of an example electrochromic thin film with the electrochromic polymer $CP_3$, according to one exemplary embodiment.

For the example electrochromic polymer with 25% TEG content, the electrochromic thin film shows purple color at the colored state and highly transparent when oxidized at 0.6 V, as shown by the cyclic voltammogram and insertions of the thin film images in FIG. 7. As shown in FIG. 8, the example electrochromic polymer thin film has high absorption at the wavelength around 580 nm when reduced (solid line), while very low absorbance in the visible light wavelength when oxidized (dashed line). The example electrochromic polymer thin film maintains a stable switching kinetic with ~60% optical contrast at 580 nm when switching between −0.2 V to 0.6 V, as shown in FIG. 9.

Figure 10:
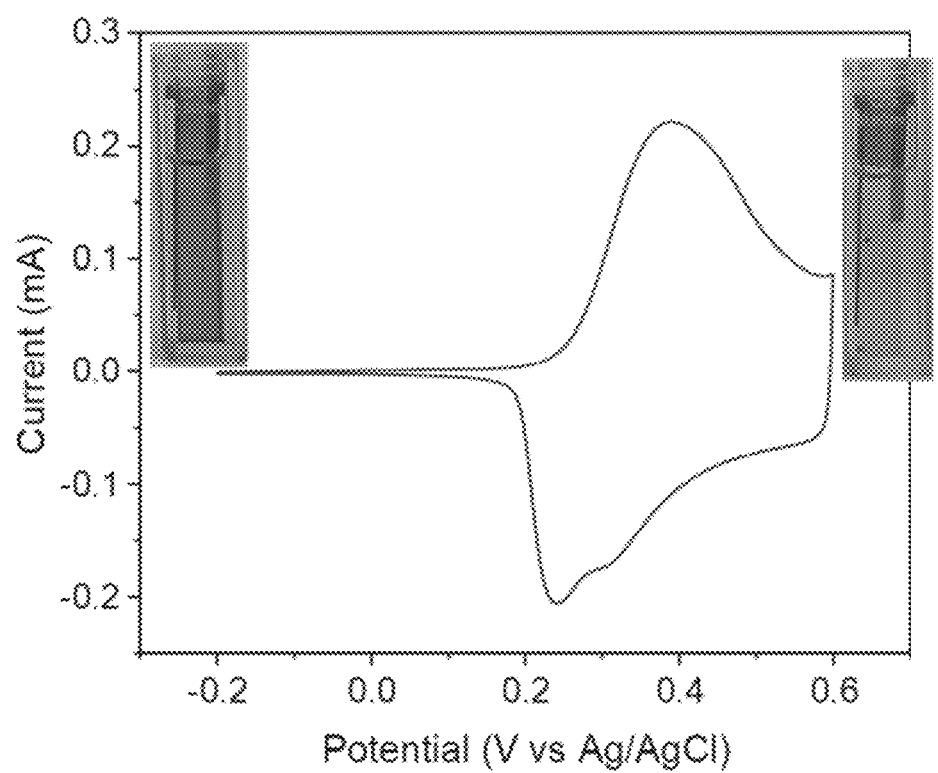
FIG. 10 shows the cyclic voltammogram of an example electrochromic thin film of the electrochromic polymer $CP_5$. The upper-right insertion is an image of the thin film at a bleached state, while the lower-left insertion is an image of the thin film at a colored state, according to one exemplary embodiment.
Figure 11:
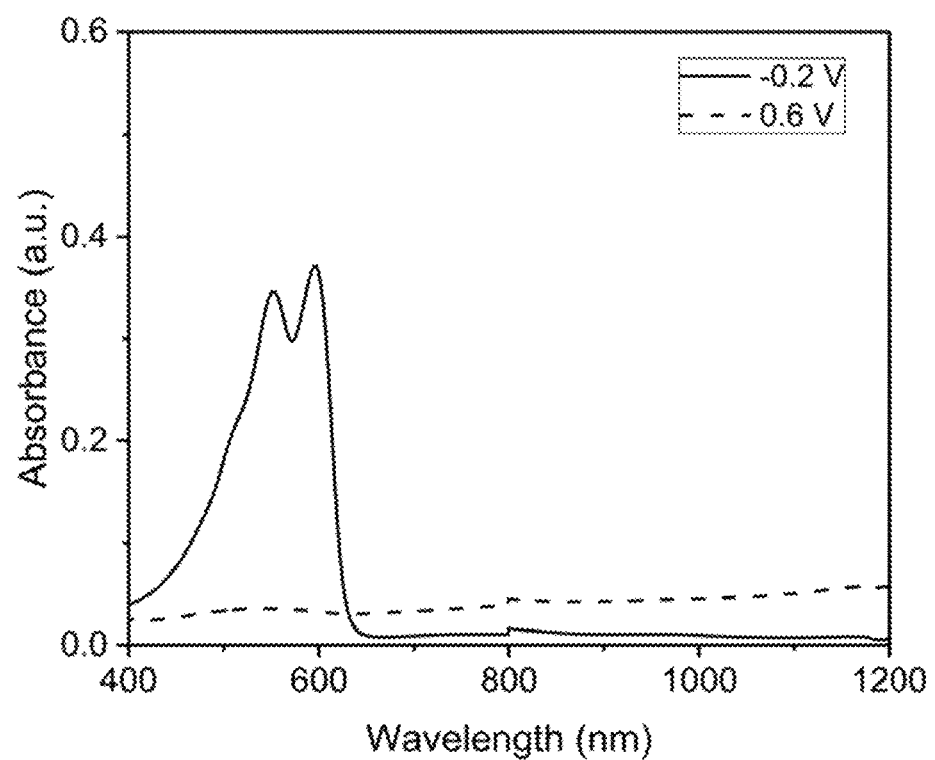
FIG. 11 is the UV-Vis absorption spectra at a colored state and a bleached state of an example electrochromic thin film of the electrochromic polymer $CP_5$, according to one exemplary embodiment.
Figure 12:
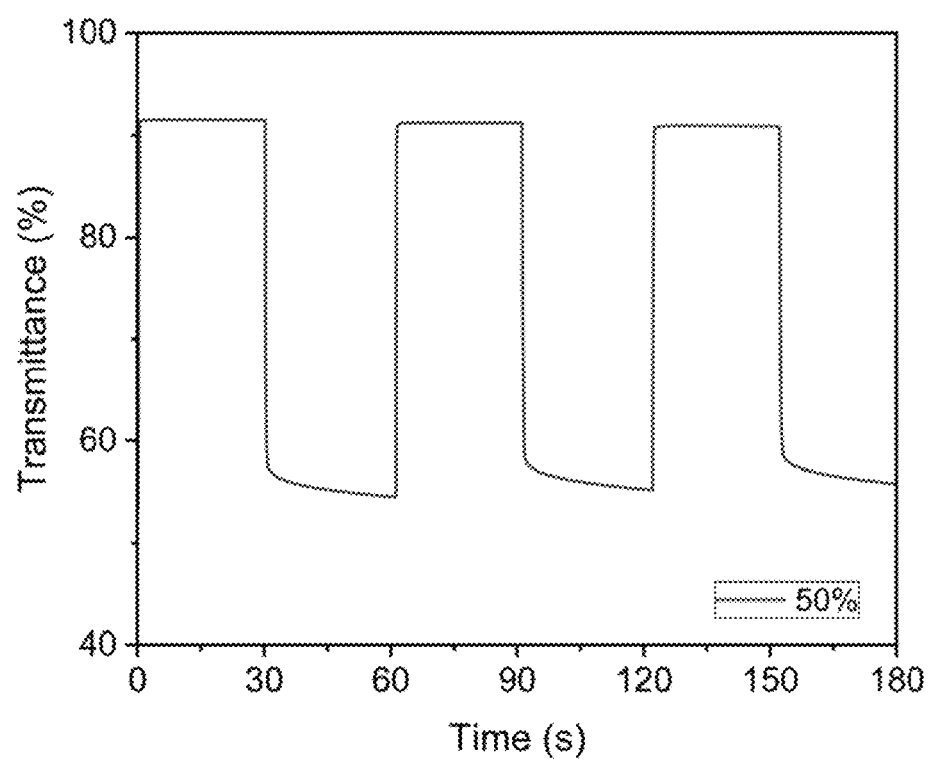
FIG. 12 is a diagram illustrating switching kinetics of an example electrochromic thin film of the electrochromic polymer $CP_5$, according to one exemplary embodiment.
Figure 13:
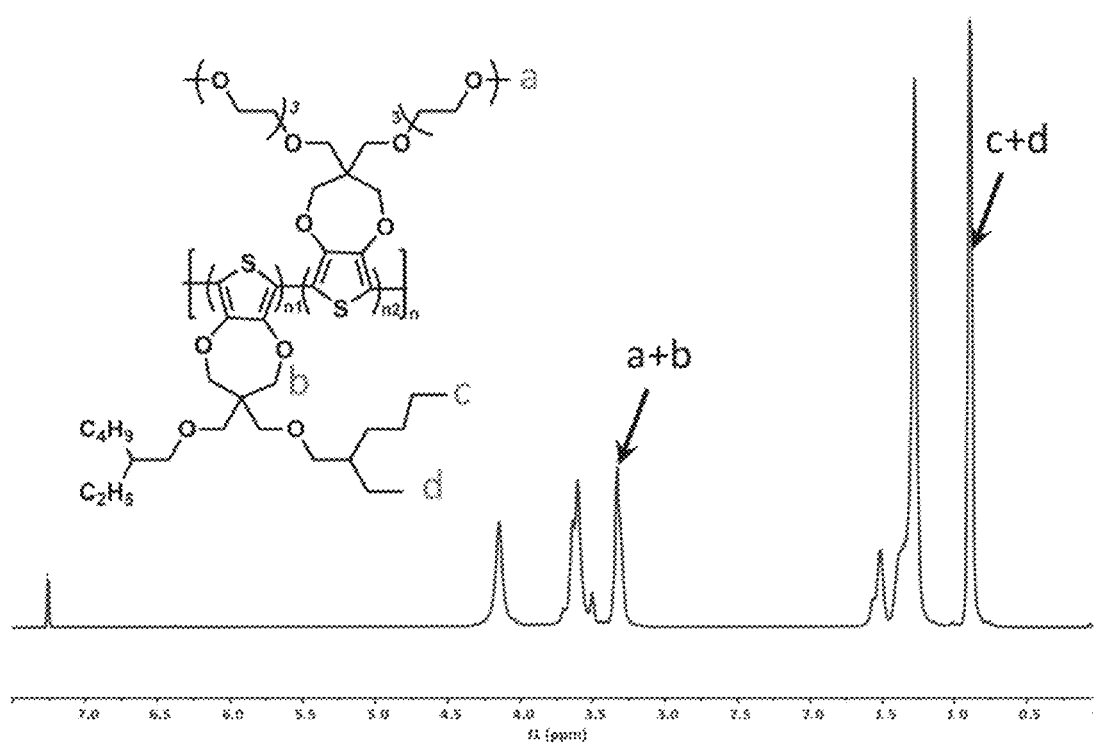
FIG. 13 is a $^1H$ NMR spectrum of the electrochromic polymer $CP_1$, according to one exemplary embodiment.
Figure 14:
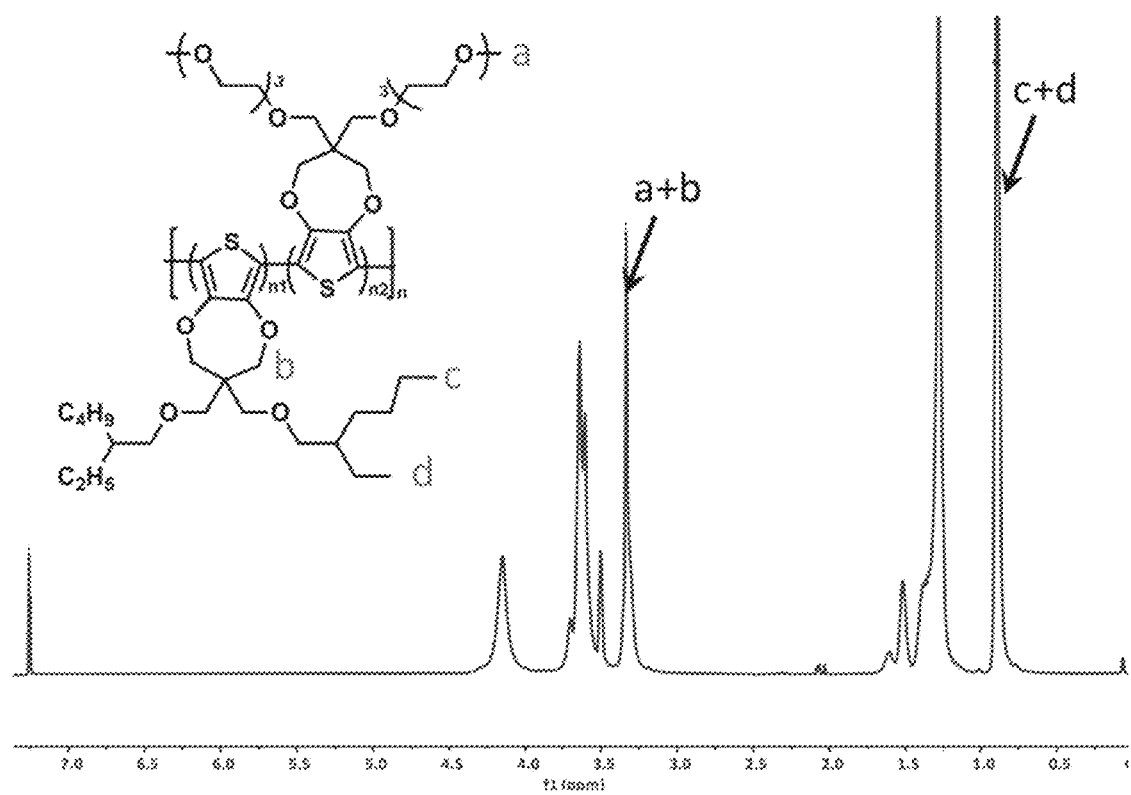
FIG. 14 is a $^1H$ NMR spectrum of the electrochromic polymer $CP_2$, according to one exemplary embodiment.
Figure 15:
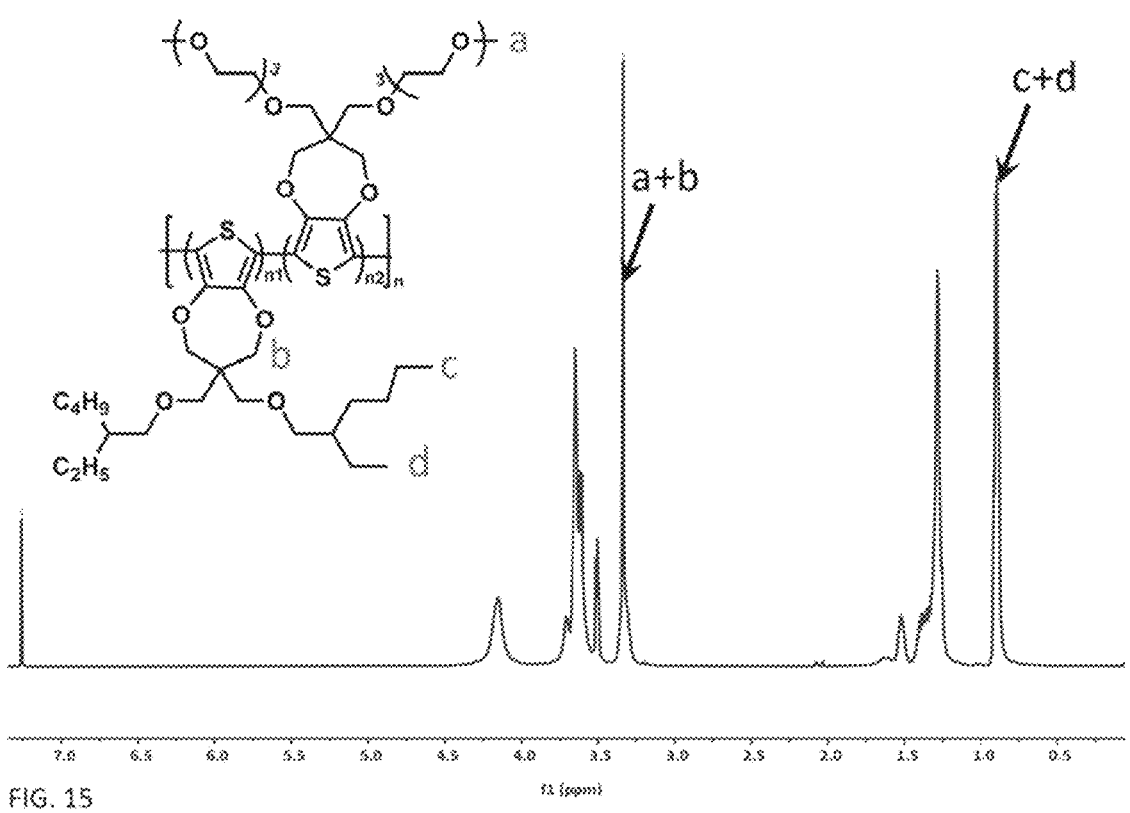
FIG. 15 is a $^1H$ NMR spectrum of the electrochromic polymer $CP_3$, according to one exemplary embodiment.
Figure 16:
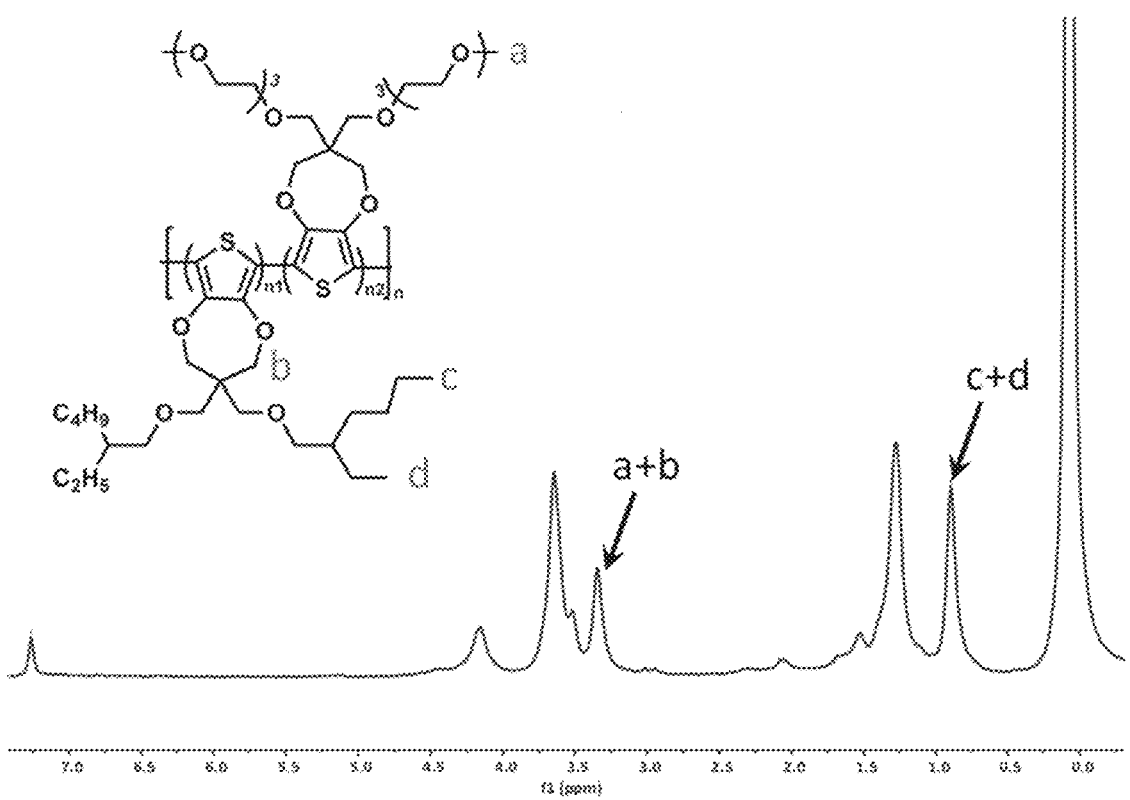
FIG. 16 is a $^1H$ NMR spectrum of the electrochromic polymer $CP_4$, according to one exemplary embodiment.
Figure 17:
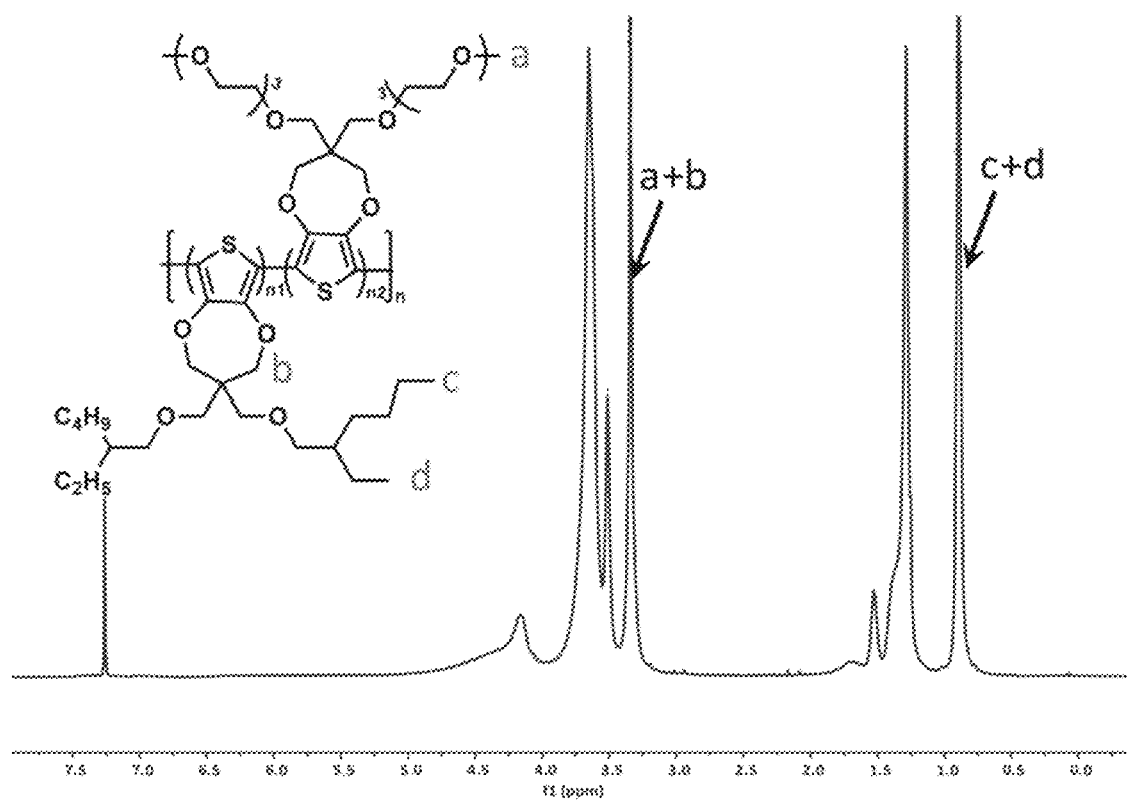
FIG. 17 is a $^1H$ NMR spectrum of the electrochromic polymer $CP_5$, according to one exemplary embodiment.
Figure 18:
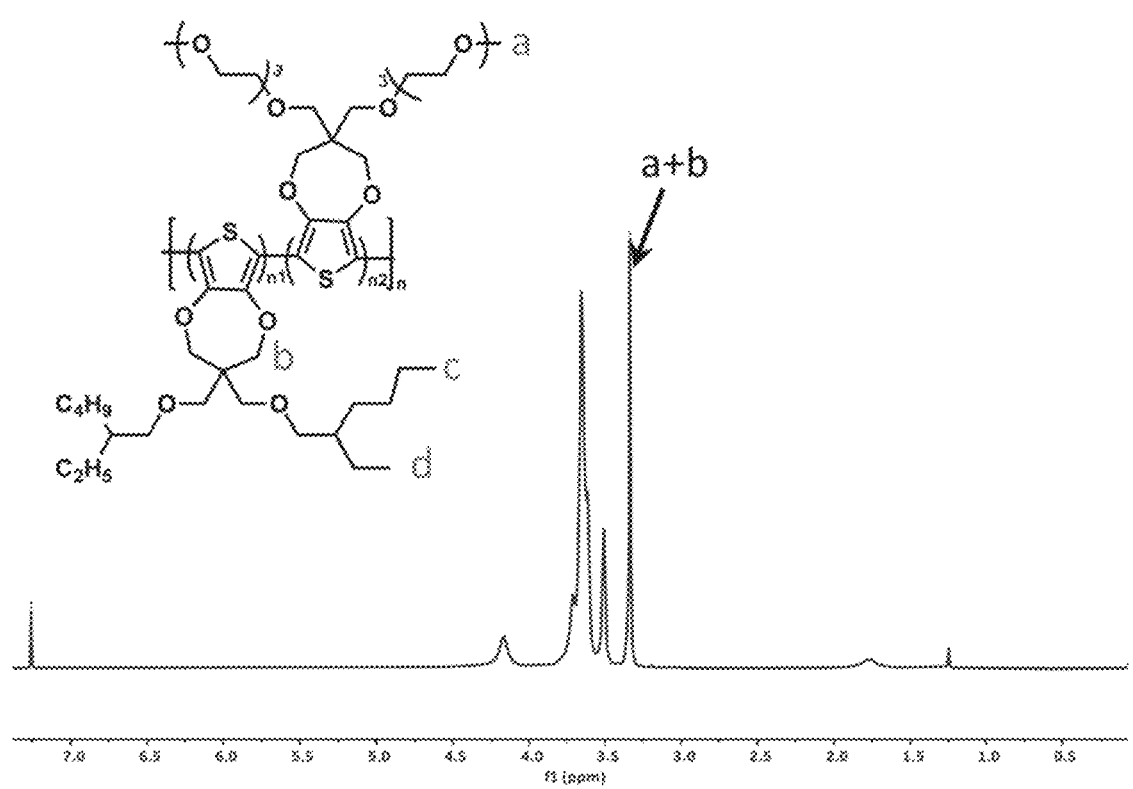
FIG. 18 is a $^1H$ NMR spectrum of the electrochromic polymer $CP_6$, according to one exemplary embodiment.

For the example electrochromic polymer with 50% TEG content, the electrochromic thin film shows purple color at the colored state and highly transparent when oxidized at 0.6 V, as shown by the cyclic voltammogram and insertions of the thin film images in FIG. 10. As shown in FIG. 11, the example electrochromic polymer thin film has high absorption at the wavelength around 580 nm when reduced (solid line), while very low absorbance in the visible light wavelength when oxidized (dashed line). The example electrochromic polymer thin film maintains a stable switching kinetic with ~40% optical contrast at 580 nm when switching between −0.2 V to 0.6 V, as shown in FIG. 12.

The method to make the disclosed electrochromic polymer with polar side chain comprises: providing monomers with polar side chains; providing monomers with alkyl side chains; producing an electrochromic polymer with a controlled ratio between polar side chains and alkyl side chains by reacting the monomers with polar side chains with the monomers with alkyl side chains with some specific ratios.

Scheme 1. General scheme for the synthesis of an electrochromic polymer with both polar side chains and alkyl side chains.

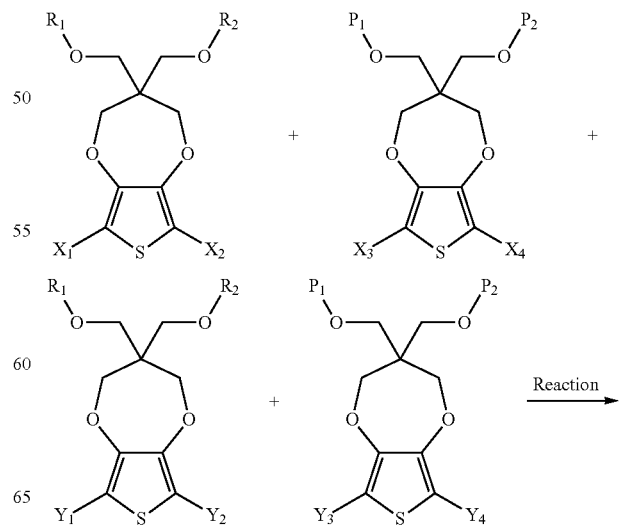

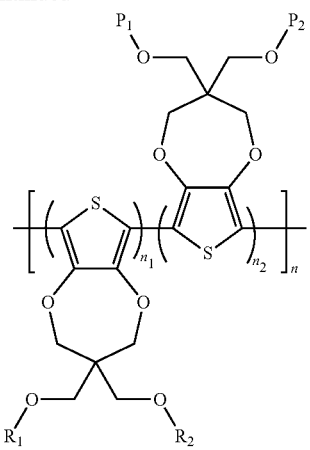

$X_1$, $X_2$, $X_3$, $X_4$, $Y_1$, $Y_2$, $Y_3$, and $Y_4$ can be any functional group that can form polymerization bond at their position, such as Cl, Br, I, H, OTf, B(OH)$_2$, Sn(Me)$_3$, Sn(Bu)$_3$, Sn($^t$Bu)$_3$, Bpin, MgBr, MgCl. And a ratio of $(X_1+X_2+X_3+X_4):(Y_1+Y_2+Y_3+Y_4)$ equals 1:1. $R_1$ and $R_2$ are independently selected from a group including, but not limited to, $C_1$-$C_{30}$ alkyl, $C_2$-$C_{30}$ alkenyl, $C_2$-$C_{30}$ alkynyl, $C_3$-$C_{15}$ cycloalkyl, $C_5$-$C_{30}$ cycloalkylalkyl, $C_3$-$C_{30}$ heterocyclylalkyl, or $C_3$-$C_{30}$ heteroarylalkyl; $P_1$ and $P_2$ are polar side chains. Example polar side chains include a group of oligoethers including one or more of the following:

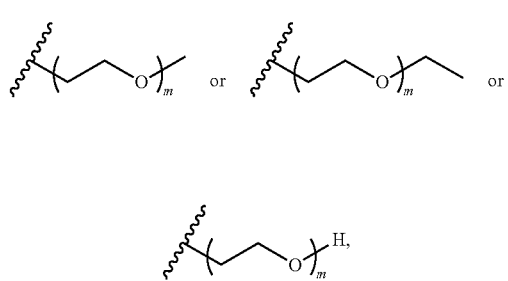

where m is an integer greater than 0. n, $n_1$, $n_2$ are integers greater than 0. The values of $n_1$, $n_2$ may indicate ratios of two monomer units (e.g., polar and alkyl), but not necessarily the real monomer sequence in the polymer. The reaction to make the polymer(s) disclosed herein might be regular polymerization or random polymerization.

Scheme 1 shows the general preparation scheme to make the disclosed electrochromic polymer. Monomers having alkyl side chains react with monomers having polar side chains, resulting in the electrochromic polymer with both polar and alkyl side chains. The reaction to form the disclosed electrochromic polymer with polar side chain can be any polymerization, and an example polymerization reaction is Direct Arylation Polymerization (DArP) between different reactive functional groups, such as DArP with Br and H.

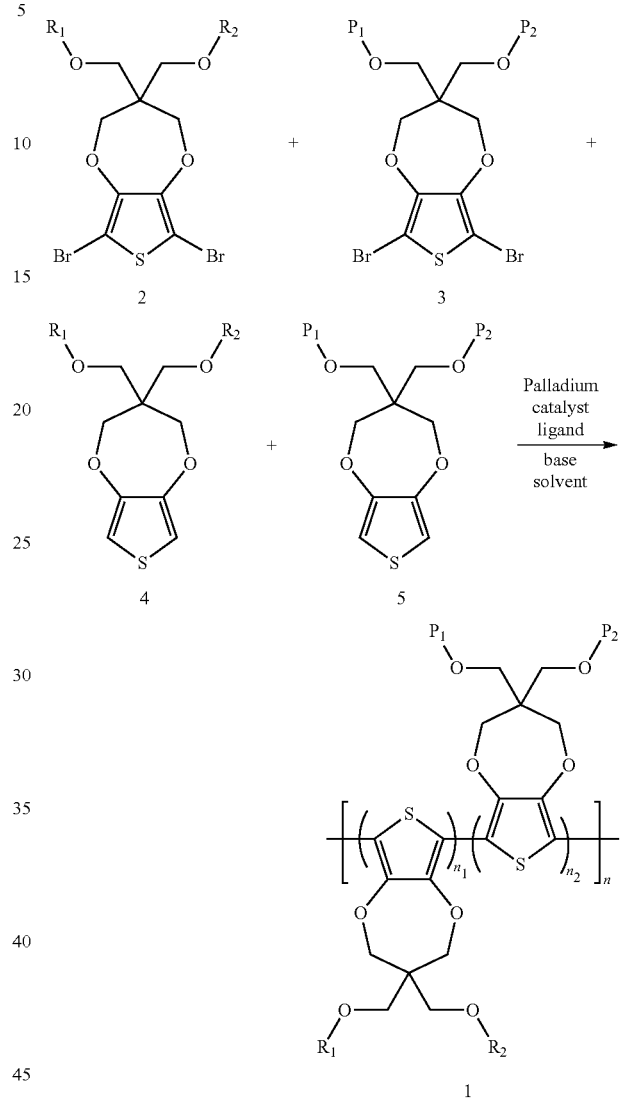

Scheme 2. Example scheme for the synthesis of an electrochromic polymer with both polar side chains and alkyl side chains via DArP with Br and H.

$R_1$ and $R_2$ are independently selected from a group including, but not limited to, $C_1$-$C_{30}$ alkyl, $C_2$-$C_{30}$ alkenyl, $C_2$-$C_{30}$ alkynyl, $C_3$-$C_{15}$ cycloalkyl, $C_5$-$C_{30}$ cycloalkylalkyl, $C_3$-$C_{30}$ heterocyclylalkyl, or $C_3$-$C_{30}$ heteroarylalkyl; $P_1$ and $P_2$ are polar side chains. Example polar side chains include a group of oligoethers, such as:

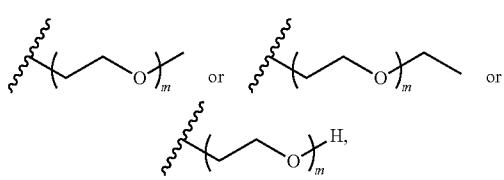

where m is an integer greater than 0. n, $n_1$, $n_2$ are integers greater than 0. The values of $n_1$, $n_2$ may indicate ratios of two monomer units (e.g., polar and alkyl), but not necessarily the real monomer sequence in the polymer. The method to make this disclosed polymer might be ordered polymerization or random polymerization.

Scheme 2 shows the example synthetic route to prepare polar side chain, and alkyl side chain-containing electrochromic polymers with formula 1 via an example reaction, Direct Arylation Polymerization (DArP). To form the polymer with formula 1, Br or H end caped monomers 2, 4 with alkyl side chains, and Br or H end caped monomers 3, 5 with polar side chains are mixed in the presence of a palladium catalyst, a ligand, a base, and a solvent, under heat to form the polymer of formula 1. The palladium catalyst may be selected from one or more of the following compounds: a palladium(II) catalyst, a palladium(0) catalyst, palladium acetate, bis(triphenylphosphine) palladium(II) dichloride, tetrakis(triphenylphosphine) palladium(0), tris(dibenzylideneacetone) dipalladium(0), or palladium chloride. The ligand may be selected from one or more of the following compounds: pivalic acid, benzoic acid, 2,2-dimethyl-hexanoic acid, 2,2-dimethyl-heptanoic acid, 2,2-dimethyl-octanoic acid, or other organic acids without alpha hydrogen. The base may be selected from one or more of the following compounds: sodium carbonate, potassium carbonate, cesium carbonate, or other bases that contain alkali metals. The solvent may be selected from one or more of the following compounds: dimethylformamide, dimethylacetamide, N-methyl-2-pyrrolidone, tetrahydrofuran, 2-methyltetrahydrofuran, toluene, dimethylbenzene, and other polar aprotic solvents. There is a molar ratio for all the four monomers and the ratio of (monomer 2+monomer 3): (monomer 4+monomer 5) is equal to 1:1.

In some embodiments, triethylene glycol (TEG) is used for the polar side chain. H and Br are used as example functional groups, DArP between H and Br are used as example reaction.

Scheme 3. Example route for the synthesis of a disclosed electrochromic polymer with TEG for polar side chains via DArP with Br and H.

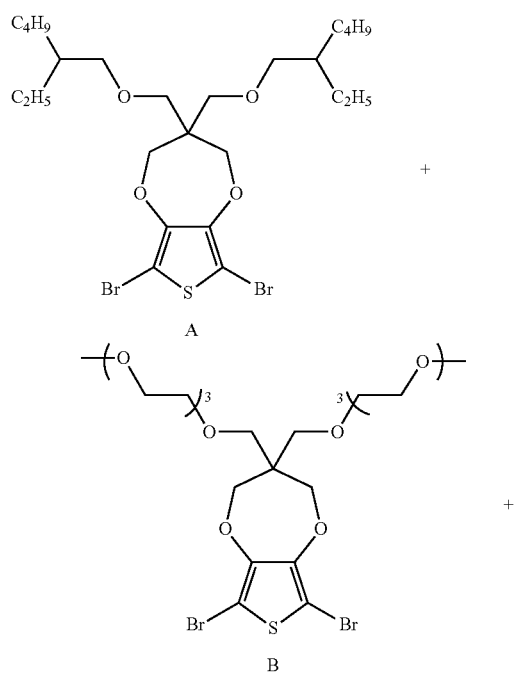

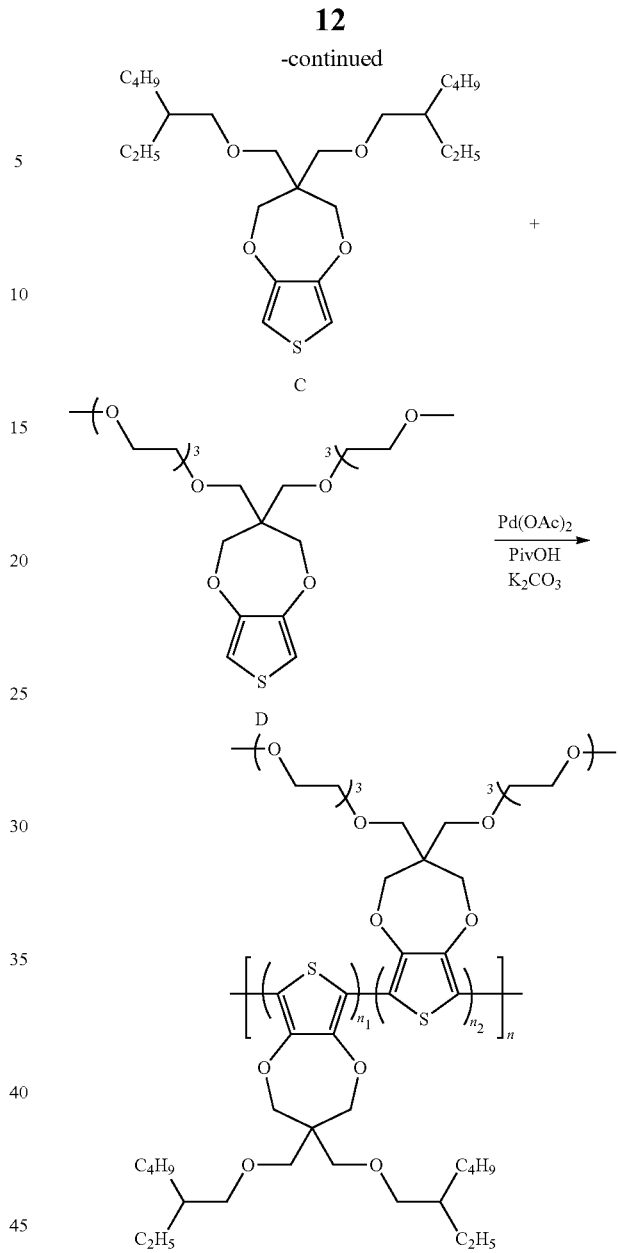

Compound A, B, C, D, PivOH (0.3 eq.) and Pd(OAc)2 (0.02 eq.) are added to a schlenck tube. The tube is kept under vacuum for about 15 minutes and then purged with $N_2$. The above process is repeated for three cycles. Then, nitrogen degassed solvent NMP is added into the tube and heated to 140° C. for 20 hours under nitrogen. Transfer the hot reaction mixture to a 1:1 mixture solvent of $CH_3OH$ and 1M HCl with stirring. Filter to get solid. The solid is dissolved in chloroform and washed with 1M HCl solution. The organic phase is concentrated and precipitated with $CH_3OH$. Filter and dry to get polymer. The yield is about 80-98%.

Different ratios among compounds A, B, C, and D can form electrochromic polymers with different concentrations of polar side chains, specified as TEG side chains here, which eventually lead to different viscosities and can be deposited onto ITO substrate as thin films with different film thicknesses. The stoichiometry of each monomer, the theoretical ratio, and the experimental ratio between the TEG side chain and alkyl side chain (as $n_2:n_1$) are shown in Table 2. The experimental TEG/alkyl side chain composition of each polymer is obtained according to the value of $^1$H NMR recorded by a Brucker ARX 500 at 293 K with deuterized chloroform as solvent at the concentration of ~25 mg/ml. The $^1$H NMR spectrum of the different electrochromic polymers are shown in FIG. 13-18.

TABLE 2

Example ratios of compounds in exemplary embodiments.

| Electrochromic polymer | A | B | C | D | Theoretical $n_2:n_1$ | Experimental $n_2:n_1$ | TEG concentration (molar %) |
|---|---|---|---|---|---|---|---|
| $CP_1$ | 1 eq | 0 | 0.9 eq | 0.1 eq | 1:19 | 1:12 | 5% |
| $CP_2$ | 1 eq | 0 | 0.7 eq | 0.3 eq | 3:17 | 1:3 | 15% |
| $CP_3$ | 1 eq | 0 | 0.5 eq | 0.5 eq | 5:15 | 1:2.1 | 25% |
| $CP_4$ | 1 eq | 0 | 0.4 eq | 0.6 eq | 6:14 | 1:1.7 | 30% |
| $CP_5$ | 1 eq | 0 | 0 | 1 eq | 1:1 | 1:1 | 50% |
| $CP_6$ | 0 | 1 eq | 0 | 1 eq | 1:0 | 1:0 | 100% |

What is claimed is:

1. An electrochromic polymer comprising a formula of

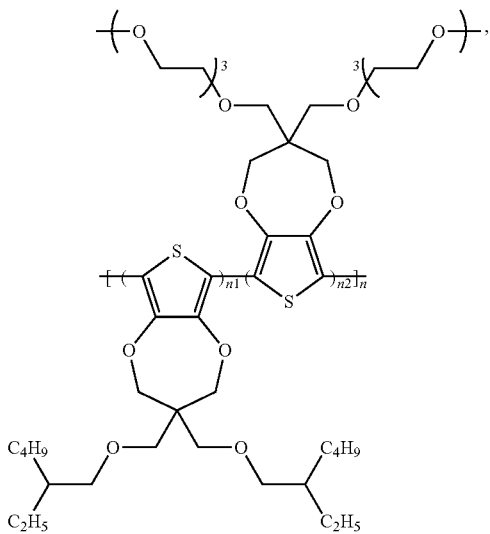

wherein, n, $n_1$, and $n_2$ are integers greater than 0; and the electrochromic polymer has an intrinsic viscosity.

2. The electrochromic polymer according to claim 1, wherein the intrinsic viscosity is controlled by adjusting a ratio between $n_1$ and $n_2$.

3. The electrochromic polymer according to claim 1, wherein $100\% \times n_2/(n_1+n_2)$ is higher than 0 molar % and lower than 50 molar %.

4. A thin film made of the electrochromic polymer according to claim 1 by coating.

5. The thin film according to claim 4, wherein a film thickness of the thin film is controlled by adjusting a ratio between $n_1$ and $n_2$.

6. A method for adjusting an intrinsic viscosity of the electrochromic polymer according to claim 1, the method comprising adjusting a concentration of polar side chains of the electrochromic polymer.

7. A method for adjusting a film thickness of a thin film made of the electrochromic polymer according to claim 1 by coating, the method comprising adjusting a concentration of polar side chains of the electrochromic polymer.

* * * * *